US006188147B1

(12) United States Patent
Hazelton et al.

(10) Patent No.: US 6,188,147 B1
(45) Date of Patent: *Feb. 13, 2001

(54) WEDGE AND TRANSVERSE MAGNET ARRAYS

(75) Inventors: Andrew J. Hazelton, San Carlos; Jean-Marc Gery, Beverly Hills, both of CA (US)

(73) Assignee: Nikon Corporation, Tokyo (JP)

( * ) Notice: Under 35 U.S.C. 154(b), the term of this patent shall be extended for 0 days.

This patent is subject to a terminal disclaimer.

(21) Appl. No.: 09/168,694

(22) Filed: Oct. 2, 1998

(51) Int. Cl.$^7$ .......................... B65G 49/07; H01L 21/00
(52) U.S. Cl. .............................. 310/12; 414/935
(58) Field of Search ............................. 310/12; 318/135; 33/1 M; 74/471 XY; 108/137, 138; 29/721, 760, 785; 414/935

(56) References Cited

U.S. PATENT DOCUMENTS

| | | | |
|---|---|---|---|
| Re. 27,289 | 2/1972 | Sawyer | 310/12 |
| Re. 27,436 | 7/1972 | Sawyer | 310/12 |
| 3,851,196 | 11/1974 | Hinds | 310/12 |
| 4,151,447 | 4/1979 | von der Heide et al. | 318/135 |
| 4,535,278 | 8/1985 | Asakawa | 318/687 |
| 4,555,650 | 11/1985 | Asakawa | 318/135 |
| 4,654,571 | 3/1987 | Hinds | 318/687 |
| 4,958,115 | 9/1990 | Miller | 318/662 |
| 5,196,745 | 3/1993 | Trumper | 310/12 |
| 5,260,580 | 11/1993 | Itoh et al. | 250/492.2 |
| 5,334,892 | 8/1994 | Chitayat | 310/12 |
| 5,477,304 | 12/1995 | Nishi | 355/53 |
| 5,528,118 | 6/1996 | Lee | 318/568.17 |
| 5,623,853 | 4/1997 | Novak et al. | 74/490.09 |
| 5,715,037 | 2/1998 | Saiki et al. | 355/53 |
| 5,723,929 | * | 3/1998 | Niimi | 310/154 |
| 5,773,837 | 6/1998 | Nakasuji | 250/412.23 |

FOREIGN PATENT DOCUMENTS

| | | |
|---|---|---|
| 07060581 | 7/1995 | (JP) . |
| WO98/49763 | 11/1998 | (WO) . |

OTHER PUBLICATIONS

David L. Trumper, Won–jong Kim, Mark E. Williams Design and Analysis Framework for Linear Permanent Magnet Machines Laboratory for Manufacturing and Productivity, Massachusetts Institute of Technology, Cambridge, MA 02139, 1994, pp. 216–223 (month unknown).

* cited by examiner

Primary Examiner—Nestor Ramirez
Assistant Examiner—Judson H. Jones
(74) Attorney, Agent, or Firm—Morrison & Foerster LLP

(57) ABSTRACT

Wedge magnet arrangements for use in a magnet array. A magnet arrangement has each wedge magnet with a magnetic flux polarized at the same angle with respect to a reference direction. The magnets are juxtaposed each other in a reference plane such that their respective magnetic fluxes combine to form a net magnetic flux along a reference direction perpendicular to the reference plane and a negligible magnetic flux in the reference plane. Transverse magnets along a plane complete flux paths between magnet arrangements and wedge magnets in the magnet array to eliminate the need for a heavy magnetically permeable backing for the magnet array. The magnet arrays have a high flux-to-mass ratio. This greater ratio improves the efficiency of two-dimensional electric motors which incorporate the magnet arrays as the moving part of the motors.

32 Claims, 15 Drawing Sheets

WEDGE AND TRANSVERSE MAGNET ARRAYS

CROSS-REFERENCE TO RELATED APPLICATION

The present application is related to the pending patent application Compact Planar Motor Having Multiple Degrees of Freedom, Ser. No. 09/135,624, filed Aug. 17, 1998, (hereinafter referred to as the "Related Patent Application"). This Related Patent Application and the present application are both assigned or under an obligation to be assigned to the same assignee.

TECHNICAL FIELD

The present invention relates generally to magnets and more particularly to magnet arrays in electric motors.

BACKGROUND ART

Electric motors are used in a variety of electrical equipment. For example, linear electric motors produce electrical power propelling an armature in one dimension. Wafer stages utilize linear electric motors to position a wafer during photolithography and other semiconductor processing.

Electric motors are used in a variety of electrical equipment. For example, linear electric motors produce electrical power propelling an armature in one dimension. Wafer stages utilize linear electric motors to position a wafer during photolithography and other semiconductor processing.

A typical one-dimensional linear electric motor has a magnet track with pairs of opposing magnets facing each other. (U.S. Pat. No. 4,151,447, Linear Motor, issued to Johann von der Heide and Georg F. Papst on Apr. 24, 1979 discusses one-dimensional linear electric motors and is incorporated by reference herein in its entirety.) Within spaces between the pairs of opposing magnets, an armature moves. The armature has windings of a conductor which are connected to an electrical current. When the electrical current is turned on, the electrical current interacts with the magnetic fields of the magnet pairs to create force on the armature. When the armature is attached to a wafer stage, the wafer stage experiences the same force which can be used to cause movement.

In a multiphase motor, the armature has various windings grouped into phases. The phase groups are selectively pulsed with electric current to create a more efficient motor. As the armature moves within the magnet track as a first group of coils is pulsed, the first group moves out of its optimal position between the pairs of magnets. Then, it becomes more efficient to pulse a second group of windings. More phase groups are theoretically more efficient since a more even application of force and utilization of power input is maintained. However, each additional phase group complicates a timing of the pulses to the various phase groups. Presently, three-phase motors and armatures have gained favor in balancing these considerations.

Linear two-dimensional motors are also used in manufacturing. (U.S. Pat. No. 4,654,571, Single Plane Orthogonally Moveable Drive System issued to Walter E. Hinds on Mar. 31, 1987 (Hinds) and U.S. Pat. No. 4,535,278, Two-Dimensional Precise Positioning Device for Use in a Semiconductor Manufacturing Apparatus issued to Teruo Asakawa on Aug. 13, 1985 (Asakawa) discuss two-dimensional linear electric motors and are incorporated by reference herein in their entirety.) The motors are two-dimensional in that they have two-dimensional arrays of magnets and armatures instead of magnet tracks and one-dimensional armatures. However, the magnet arrays and two-dimensional armatures may move with respect to each other in more than two dimensions depending upon the design. Conventional two-dimensional linear motors typically have an array of magnets and an armature having one or more coils on one side of the array of magnets. When attached to part of a two-dimensional linear motor, a platform can be moved in two or more dimensions by the motor. For example, a wafer stage in semiconductor processing equipment may be attached to an armature or magnet array of a two-dimensional motor, and the two-dimensional motor would control positioning of the wafer stage.

A problem with conventional magnet arrays is their relatively low magnetic flux-to-mass ratio. Without a backing by a magnetically permeable material, the flux is fairly low. A magnetically permeable backing permits completed flux paths between magnets having the same polarity. Of course, the flux of the array is greater when the flux paths are completed by the magnetically permeable backing. However, magnetically permeable materials, such as iron, are relatively heavy. If the flux paths between the magnets of the same polarity could still be completed without using a heavy magnetically permeable backing, the magnetic flux-to-mass or weight ratio would be improved. For electric motors having moving magnets instead of moving coils, this reduction in mass or weight would improve the efficiency of the motors.

SUMMARY OF THE INVENTION

The invention features a magnet arrangement useable in a magnet array. The magnet arrangement includes a plurality of wedge magnets arranged in a reference plane. Each wedge magnet contains a material polarized in a first direction at a non-zero non-perpendicular angle with respect to a portion of its surface and the reference plane. The arrangement also includes a plurality of other magnets polarized in a second direction. The wedge magnets are in proximity to the other magnets, wherein the first and second directions of polarization are at an angle with respect to each other. A magnetic flux path is formed through the other magnet and the wedge magnet.

In some embodiments, a magnet arrangement has each wedge magnet with a magnetic flux polarized at the same angle with respect to a reference direction. The magnets are juxtaposed each other such that their respective magnetic fluxes combine to form a net magnetic flux in a reference direction perpendicular to the reference plane and a negligible magnetic flux along the reference plane.

The invention also features an electric motor. The electric motor has a coil array and the inventive magnet array. The magnet array includes wedge magnets. In some embodiments, an arrangement of magnets forms a concave surface. Each magnet in the arrangement has a magnetization direction at an angle with respect to a reference direction, but the arrangement's net magnetic flux is along the reference direction.

The invention's wedge magnets have an advantage that they can be appropriately arranged to form an array with a greater flux-to-mass ratio than conventional magnet arrays. In some embodiments, a magnetically permeable backing of a conventional magnet array can be replaced by magnetically impermeable material such as a ceramic. Magnetically impermeable materials such as ceramics and plastics generally have lower mass densities than magnetically permeable materials such as iron. By completing flux paths between wedge magnets via transverse magnets with the present invention instead of between conventional magnets via the magnetically permeable backing as in conventional designs, the magnetic flux is improved while the array's mass decreased. Flux-to-mass ratios of approximately 1.5 to 2 times previous flux-to-mass ratios of conventional magnet arrays of comparable size are anticipated.

In an electric motor where a magnet array moves in response to current commutation of coils, the improved flux-to-mass ratio of the inventive magnet arrays have a further advantage of improved electric motor efficiency. As measured in $I^2R$ dissipation, the range of flux mass ratios stated above implies an improved motor efficiency of approximately 30% to 50% compared with conventional electric motors.

These and other objects, features, and advantages of the invention will become readily apparent to those skilled the art upon a study of the following drawings and a reading of the description of the invention below.

BRIEF DESCRIPTION OF THE DRAWINGS

FIG. 3A is a perspective view; FIG. 3B a side projection view; FIG. 3C is a front view; and FIG. 3D is a top view.

FIG. 4A is a perspective view; FIG. 4B a side projection view; FIG. 4C is a front view; and FIG. 4D is a top view.

FIG. 5A is a perspective view; FIG. 5B a side projection view; FIG. 5C is a front view; and FIG. 5D is a top view.

DESCRIPTION OF THE INVENTION

For background material, the reader is directed to the following standard textbooks all of which are incorporated by reference herein in their entirety: Amitava Basak, *Permanent-Magnet DC Linear Motors*, Clarendon Press, 1996; Richard P. Feynman et al., *Feynman Lectures on Physics*, Addison-Wesley, 1962; David Halliday and Robert Resnick, *Fundamentals of Physics*, Second Edition, Extended Version, Revised Printing, John Wiley & Sons, 1986; D. C. Hanselman, *Brushless Permanent-Magnet Motor Design*, McGraw-Hill, 1994; J. R. Hendershot, Jr. and T. J. E. Miller, *Design of Brushless Permanent-Magnet Motors*, Magna Physics and Clarendon, 1994; Edward M. Purcell, *Electricity and Magnetism*, McGraw-Hill, 1965.

The reader is also referred to patents for additional background material. For one-dimensional motors, the reader is referred to U.S. Pat. No. 4,151,447, Linear Motor, issued to Johann von der Heide and Georg F. Papst on Apr. 24, 1979 which is incorporated by reference herein in its entirety. For two-dimensional electric motors and their magnet arrays, the reader is referred to the following U.S. Patents which are incorporated by reference herein in their entirety: U.S. Pat. No. 4,535,278, Two-Dimensional Precise Positioning Device for Use in a Semiconductor Manufacturing Apparatus issued to Teruo Asakawa on Aug. 13, 1985 (Asakawa); U.S. Pat. No. 5,334,892, Positioning Device for Planar Positioning issued to Anwar Chitayat on Aug. 2, 1994 (Chitayat); and U.S. Pat. No. 4,654,571, Single Plane Orthogonally Moveable Drive System issued to Walter E. Hinds on Mar. 31, 1987 (Hinds). Also, the Related Patent Application is incorporated by reference herein in its entirety.

The following disclosure contains a description of the best-contemplated mode of carrying out the invention. This disclosure is made for the purpose of illustrating the general principles of the invention and should not be taken in a limiting sense. The scope of the invention is best determined by reference to the appended claims.

Figure 1A:
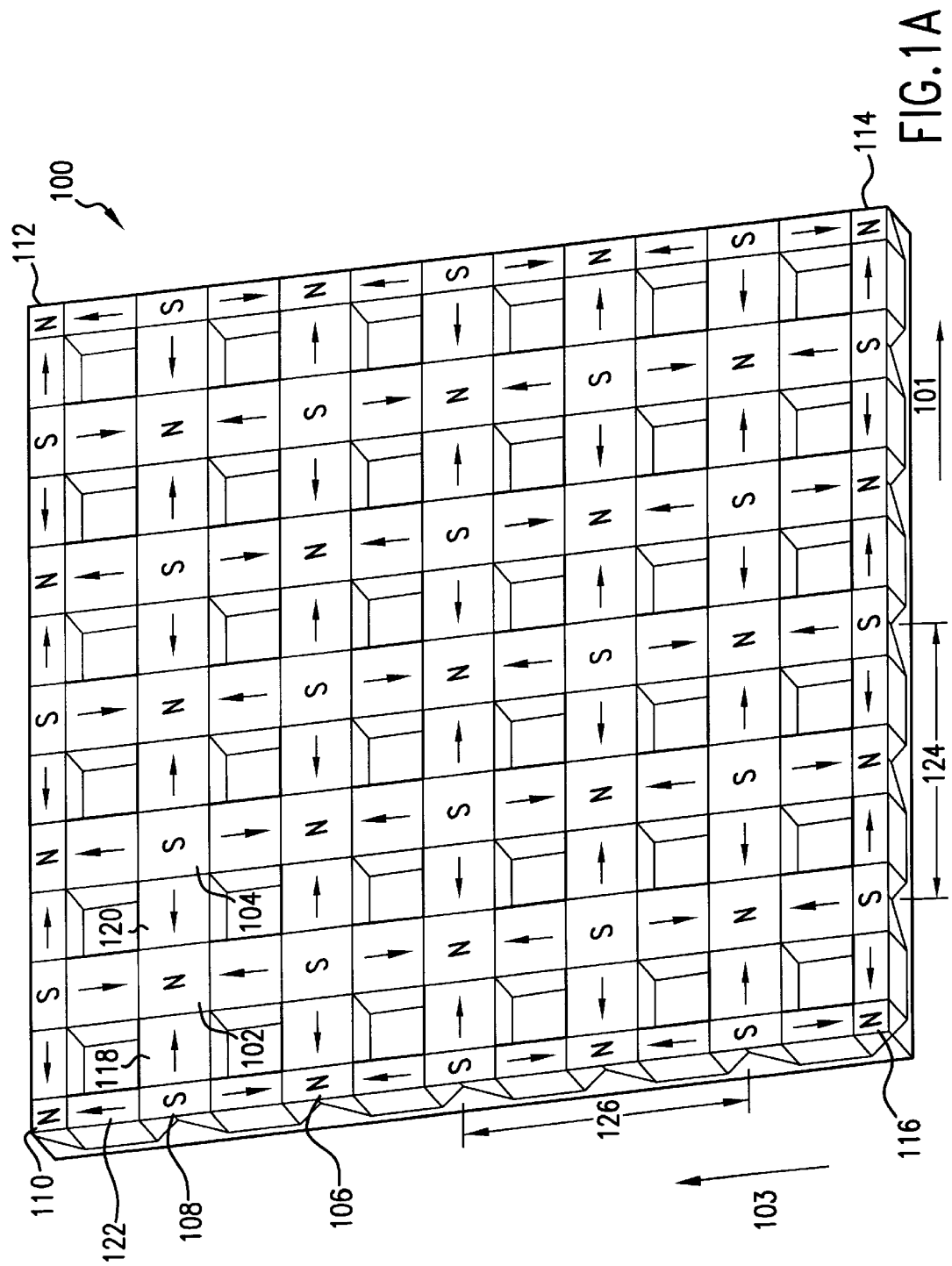
FIG. 1A diagrammatically illustrates a magnet array in accordance with one embodiment of the present invention.

FIG. 1A diagrammatically illustrates an embodiment 100 of a magnet array in accordance with the present invention. The magnet array 100 has a number of magnets distributed in a first direction 101 and a second direction 103 to form a two-dimensional magnet array.

The magnets in the array 100 are grouped into magnet arrangements separated by transverse magnets. The magnet arrangements have polarities perpendicular to the first direction 101 and the second direction 103. Each of the magnet arrangements, such as magnet arrangements 102, 104, 106, and 110, has wedge magnets. As will be shown below, each wedge magnet in the magnet arrangements has a polarization direction at an acute angle with respect to a reference plane or surface determined by the directions 101 and 103. Conventional designs do not use wedge magnets in two-dimensional magnet arrays.

Interior magnet arrangements, such as magnet arrangements 102 and 104, have approximately equal fluxes. However, the magnet arrangements alternate in polarity. Thus, magnet arrangements 102 and 104 in FIG. 1A have opposite polarities.

Exterior magnet arrays have fluxes which are fractions of the interior magnet arrangements in some embodiments. In FIG. 1A, magnet arrangements 106, 108, 110, 112, 114 and 116 all are exterior magnet arrangements. However, not all exterior magnet arrangements have the same flux in all embodiments. For example, in some embodiments of the magnet array 100 in FIG. 1A, exterior magnet arrangements 106 and 108 have half the flux of each magnet arrangements 102 and 104, and corner exterior magnet arrangements 110, 112, 114, and 116 have one-quarter the magnetic flux of each interior magnet arrangement, such as magnet arrangements 102 and 104.

The transverse magnets have polarities parallel to the surface defined by the directions 101 and 103. They are placed between the magnet arrangements to complete flux paths. For example, transverse magnet 118 completes a flux path between magnet arrangements 102 and 108, and transverse magnet 120 completes a flux path between magnet arrangement 102 and magnet arrangement 104. Similarly, transverse magnet 122 completes a flux path between magnet arrangement 108 and magnet arrangement 110.

As with the magnet arrangements, exterior transverse magnets, such as transverse magnet 122, have fractional fluxes of interior transverse magnets, such as transverse magnets 118 and 120. In some embodiments, exterior transverse magnet 122 has half the flux of interior transverse magnets 118 and 120.

Figure 1B:
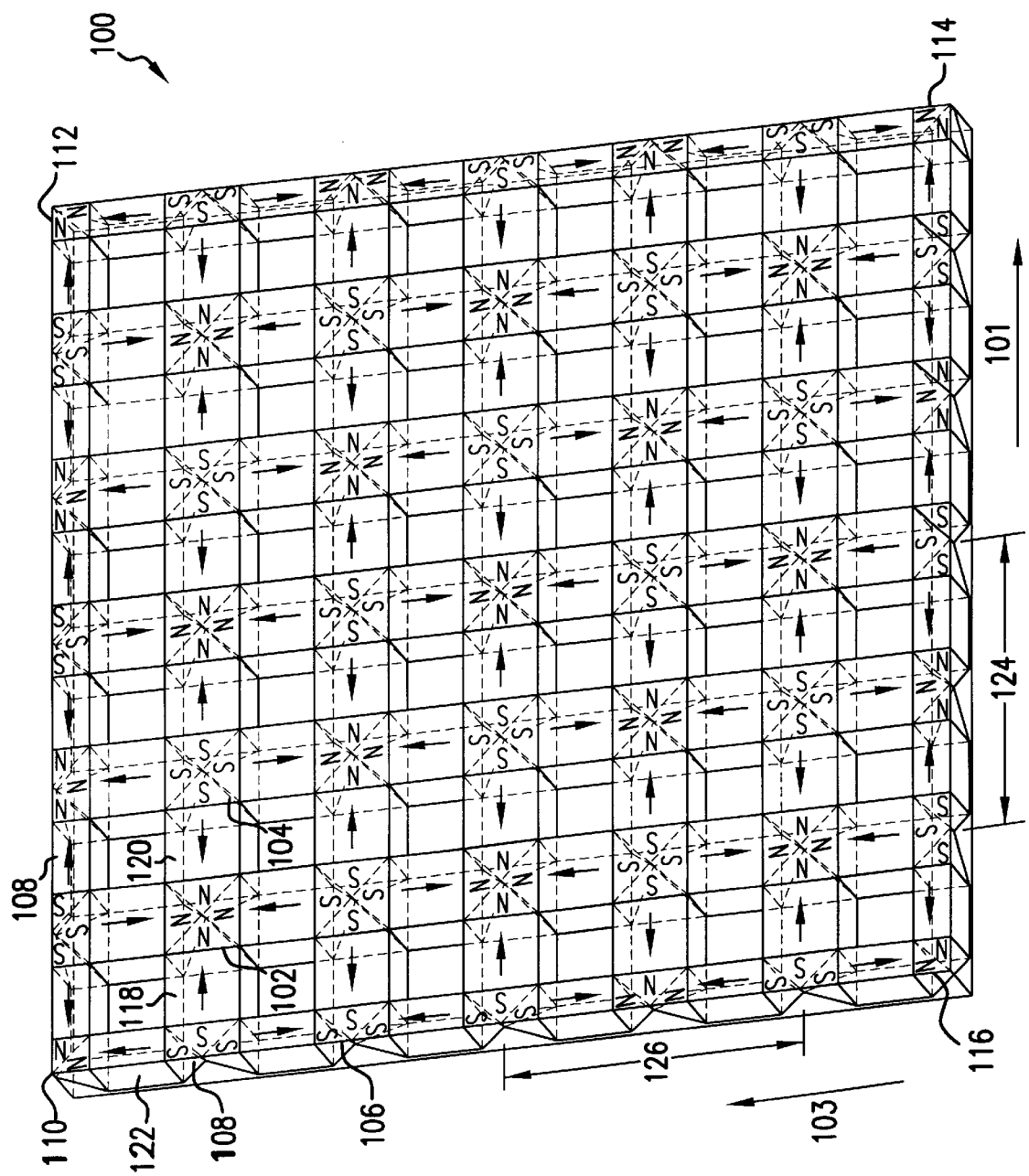
FIG. 1B diagrammatically illustrates the wedge magnet structure of magnet arrangements in the magnet array in FIG. 1A in accordance with one embodiment of the present invention.
Figure 1C:
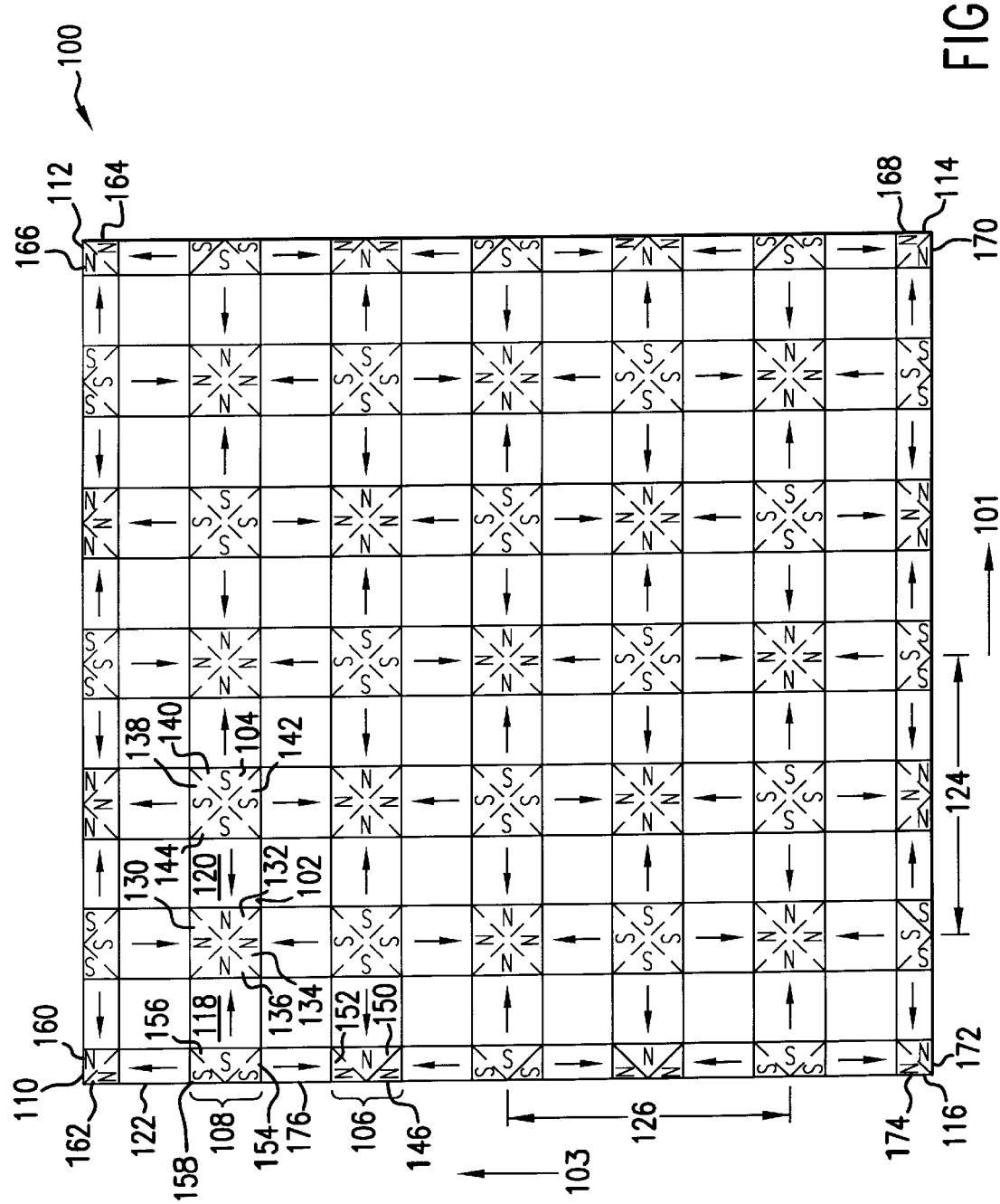
FIG. 1C diagrammatically illustrates a top view of the magnet array of FIGS. 1A–1B showing the wedge magnet structure.
Figure 1D:
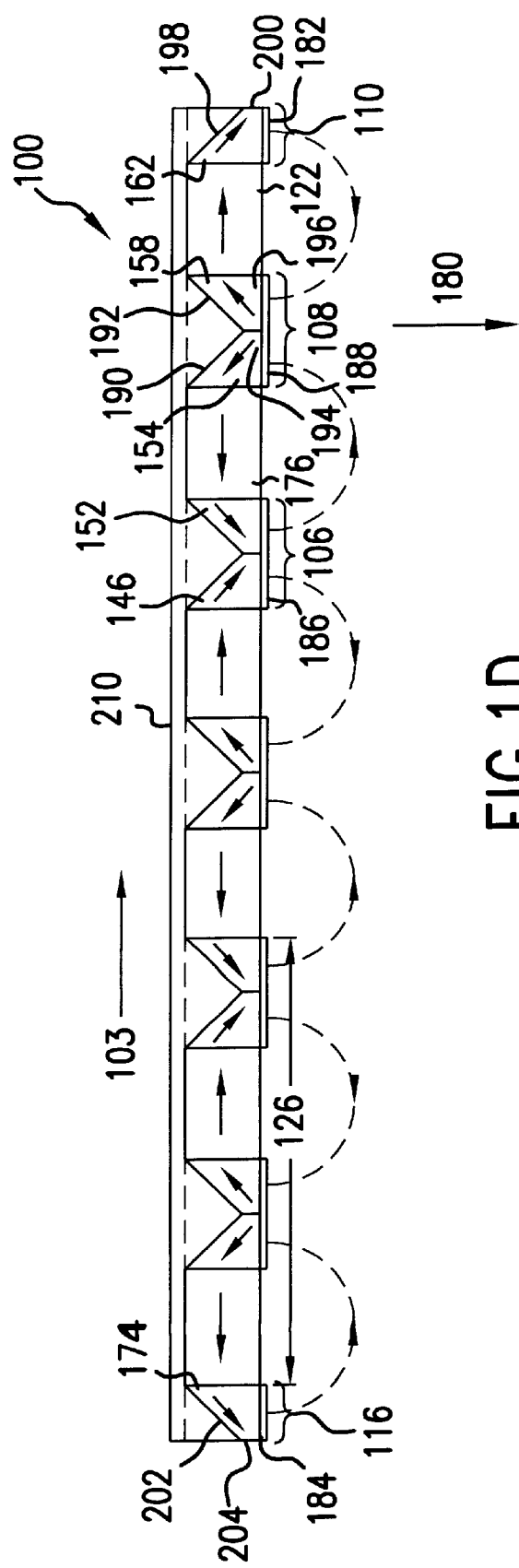
FIG. 1D diagrammatically illustrates a side view of the magnet array of FIGS. 1A–1C.

With the wedge magnets juxtaposed as illustrated, their respective magnetic fluxes combine to form a resultant magnetic flux in directions perpendicular to the directions 101 and 103 (i.e., perpendicular to the reference plane defined by the directions 101 and 103; see FIG. 1D). The combination of the wedge magnets in the magnet arrangements and the transverse magnets results in a dramatic increase in magnetic flux in directions perpendicular to the directions 101 and 103. Completion of the flux paths in this way provides a much higher flux-to-mass ratio for the magnet array 100 without usage of heavy magnetically permeable backings.

The magnetic polarity of the magnet array 100 is periodic in both directions 101 and 103. The array 100 has a magnetic periodicity 124 in the direction 101 and a magnetic periodicity 126 in the direction 103. The magnetic periodicities 124 and 126 are not required to be equal. Both magnetic periodicities 124 and 126 are twice the structural periodicity displayed in the magnetic array 100. The width (in the direction 101) and length (in the direction 103) of the transverse magnets are scaled relative to the periodicities 124 and 126, excluding, of course, the exterior transverse magnets. Similarly, for polarities of the transverse magnets denoted by the arrows in FIG. 1A, the magnet array 100 has magnet arrangements on diagonals of the directions 101 and 103 having all the same polarity. Also, for each row in the direction 101, the magnet arrangements alternate in polarity. Similarly, for each column in the direction 103, the magnet arrangements also have alternating polarities. In other embodiments, such as the embodiment described below with reference to FIG. 2, the invention's magnet array has magnet arrangements of the same polarity in each row, but the rows alternate in polarity.

FIG. 1B explicitly shows the wedge magnet structure of the magnet arrangements in the magnet array 100. In the particular embodiment, the interior magnet arrangements, such as magnet arrangements 102 and 104, have four wedge magnets. Each of the interior wedge magnet arrangements forms a flat surface on top of the magnet arrangement. Each interior magnet arrangement also forms a concave, faceted (pyramid shaped) bottom surface. The corner magnet arrangements 110, 112, 114, and 116, each have two wedge magnets. Each of the corner magnet arrangements also has a flat top surface and a concave, faceted bottom surface. Exterior magnet arrangements which are not at the corners, such as magnet arrangements 106 and 108, has three wedge magnets. The three wedge magnets form a flat top surface and a faceted, concave bottom surface, too.

FIG. 1C is a top view of the magnet array 100 showing the wedge magnet structure. In this particular embodiment, wedge magnets 130, 132, 134, and 136 make up the magnet arrangement 102. The wedge magnets 130, 132, 134, and 136 have the same shape and are symmetrically placed about a central axis out of the page of the magnet arrangement 102. In some embodiments, the wedge magnets 130, 132, 134, and 136 all have the same relationship of their respective polarization directions with respect to their surfaces. Their respective magnetic fluxes combine to give a flux in the reference direction out of the page perpendicular to the directions 101 and 103 and parallel to the central axis. In some embodiments, magnetic flux components of the wedge magnets 130, 132, 134, and 136 essentially cancel in the directions 101 and 103 to give a net magnetic flux only in the reference direction out of the page. Similar requirements may be imposed upon other wedge magnets forming other magnet arrangements in the array 100. For example, wedge magnets 138, 140, 142, and 144, making up the magnet arrangement 104, may have canceling magnetic fluxes in horizontal directions 101 and 103 to leave a net magnetic flux in the reference direction.

As mentioned above, the exterior magnet arrangements also have wedge magnets. For example, wedge magnet arrangements 106 and 108, which are not at corners of the magnet array 100 have three wedge magnets each; magnet arrangement 106 has wedge magnets 146, 150, and 152, while the magnet arrangement 108 has wedge magnets 154, 156, and 158. The corner magnet arrangements 110, 112, 114, and 116 each have two wedge magnets: wedge magnets 160 and 162 for 110, wedge magnets 164 and 166 for 112, wedge magnets 168 and 170 for 114, and wedge magnets 172 and 174 for 116. The wedge magnets in the exterior magnet arrangements are arranged to have half the magnetic flux in the reference direction of the interior magnet arrangements for the exterior magnet arrangements not on the corners. The wedge magnets in the exterior corner magnet arrangements 110, 112, 114, and 116 are arranged to provide one-quarter of the magnetic flux of the interior magnet arrangements in the reference direction.

Each of the transverse magnets in the magnet array 100 is between two associated wedge magnets. For example, transverse magnet 118 is between associated wedge magnets 136 and 156, and transverse magnet 120 is between associated wedge magnets 132 and 144. Similarly, the exterior transverse magnet 122 is between associated wedge magnets 158 and 162, and transverse magnet 176 is between associated wedge magnets 152 and 154.

FIG. 1D shows a side view of the magnet array 100. (FIG. 1D is also representative of a cross section of the magnet array 100.) In this figure, the reference direction 180 is shown explicitly. The side shown extends from the corner magnet arrangement 116 to the corner magnet arrangement 110 in the direction 103. In the illustrated embodiment, each magnet arrangement has a focusing magnet polarized, positively or negatively, along the reference direction 180 to assist each magnet arrangement in having a relatively uniform magnetic field along, positively or negatively, the reference direction 180. For example, the corner magnet 110 has a focusing magnet 182 of north polarity oriented while the magnet arrangement 116 has a focusing magnet 184 of north polarity. Similarly, magnet arrangements 106 and 108 have focusing magnets 186 and 188, as do all the other magnet arrangements in the magnet array 100.

The polarities of the wedge and transverse magnets are shown in FIG. 1D. Although the precise geometry of the wedge magnets is somewhat different for the interior wedge magnets compared with those shown in FIG. 1D, the polarity profile is essentially the same. For convenience of discussion, we will assume that all of the wedge magnets for the exterior magnet arrangements that are not at the corners, such as magnet arrangements 106 and 108, are essentially identical. Wedge magnets 154 and 158 in the magnet arrangement 108 have identical shapes. Their polarities as shown are parallel to surfaces 190 and 192, respectively, and at a 45-degree angle with respect to the reference direction 180. Of course, we are assuming that 45 degrees is equivalent to 135 degrees. This directly implies that the respective polarities are at 45-degree angles with respect to facets or surfaces 194 and 196 of the wedge magnets 154 and 158. The wedge magnets 162 and 174 in the corner magnet arrangements 110 and 116 have similar relationships; the polarization of wedge magnet 162 is approximately parallel to a surface 198 and at a 45-degree angle with respect to surface 200 while the polarization of 174 is approximately parallel to a surface or facet 202 and at a 45-degree angle with respect to a surface 204. As is readily apparent to one of ordinary skill in the art, each focusing magnet combined with a juxtaposed wedge magnet next to a transverse magnet, which is in turn next to another wedge magnet and a second focusing magnet, collectively form a flux path. One of ordinary skill will also notice that sub-combinations of the flux path also form flux paths.

It is noted that while FIG. 1D illustrates the use of focusing magnets, they are not essential for all embodiments. Focusing magnets may be omitted in some embodiments.

Figure 1E:
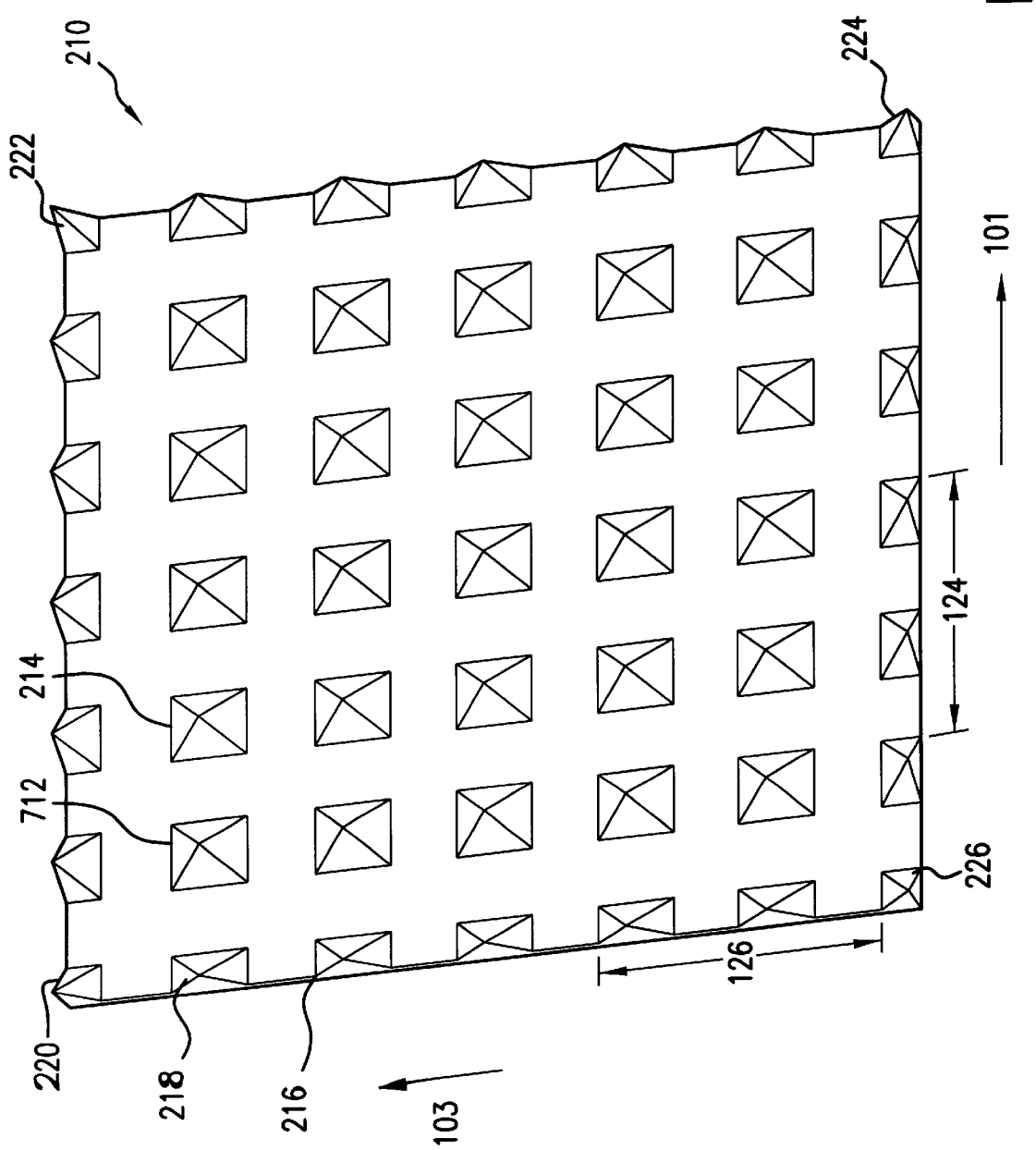
FIG. 1E diagrammatically illustrates a backing of the magnet array in accordance with one embodiment of the present invention.

A backing panel 210 is also shown in FIGS. 1D and 1E. To increase flux in the reference direction 180 with respect to mass of the magnet array 100, the backing panel is generally a magnetically impermeable material. Of course, in each direction 101 and 103, the structural periodicity is one-half the corresponding magnetic periodicity 124 or 126. The backing panel 210 has a number of convex pyramid shaped projections. Each convex projection corresponds to a magnet arrangement placed over it. For example, convex projections 212 and 214 correspond to magnet arrangements 102 and 104. The convex projections 212 and 214 are faceted and mate with the concave surfaces formed by the magnet arrangements 102 and 104. More specifically, wedge magnets 130, 132, 134, and 136 shown in FIG. 1C form a concave surface which mates with the convex projection 212 as shown in FIG. 1E. Similarly, wedge magnets 138, 140, 142, and 144 form a concave surface which mates with the convex projection 214. Similarly, wedge magnets 146, 150, and 152 form the concave surface which mates with the concave projection 216, and the wedge magnets 154, 156, and 158 of the exterior magnet arrangement 108 form the concave surface which mates with a convex projection 218 on the backing panel 210. Likewise, the wedge magnets for the corner magnet arrangement 110, 112, 114, and 116 form four concave, faceted surfaces which mate with corresponding convex projections on the backing panel 210: 160 and 162 with projection 220, 164 and 166 with projection 222, 168 and 170 with projection 224, and 172 and 174 with projection 226.

The backing panel 210 does not necessary require the convex projections. In another embodiment, the concave surfaces defined by the wedge magnets may be filled with epoxy and a flat backing panel is bonded to the epoxy.

Figure 8A:
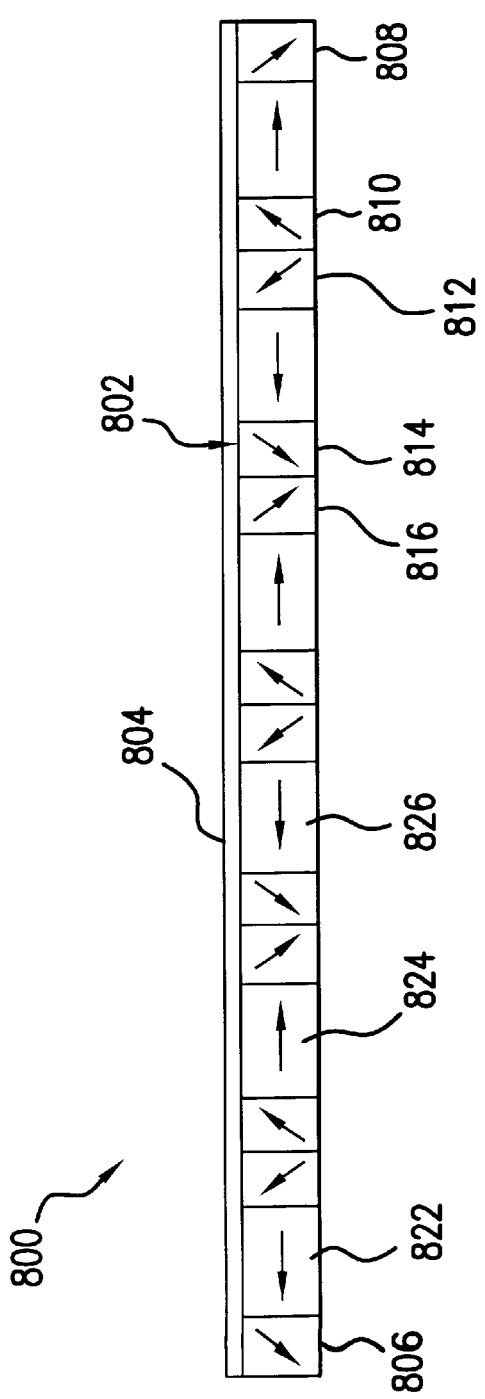
FIGS. 8A–C illustrate a magnet arrangement comprising wedge magnets having a cylindrical geometry in accordance with another embodiment of the present invention.
Figure 8B:
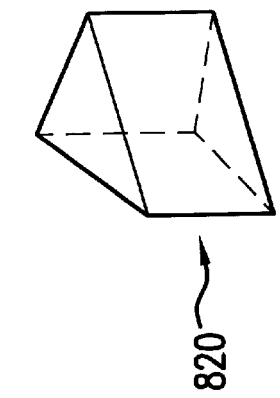
Figure 8C:
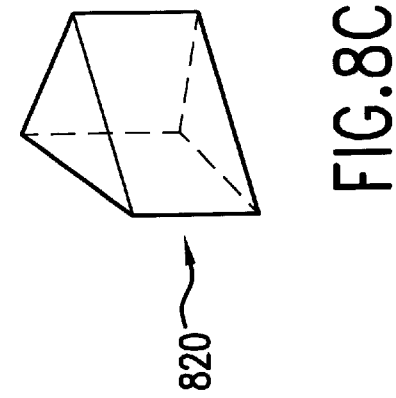

In a further embodiment as illustrated in FIGS. 8A–C, the wedge magnets may define a flat surface 802 instead of a concave surface to which a flat backing panel 804 is bonded (see FIG. 8A). In which case, the backing plate and the geometry of the wedge magnets are less complicated than the geometry of the wedge magnets in the previous embodiments. Each wedge magnet would be in the shape of a regular 5-sided triangular prism (see FIGS. 8B and C and the discussion in connection therewith below), which is relatively easier and less expensive to produce. However, the weight of the wedge magnets would be relatively heavier, so the magnetic flux to mass ratio would be relatively lower.

Figure 2:
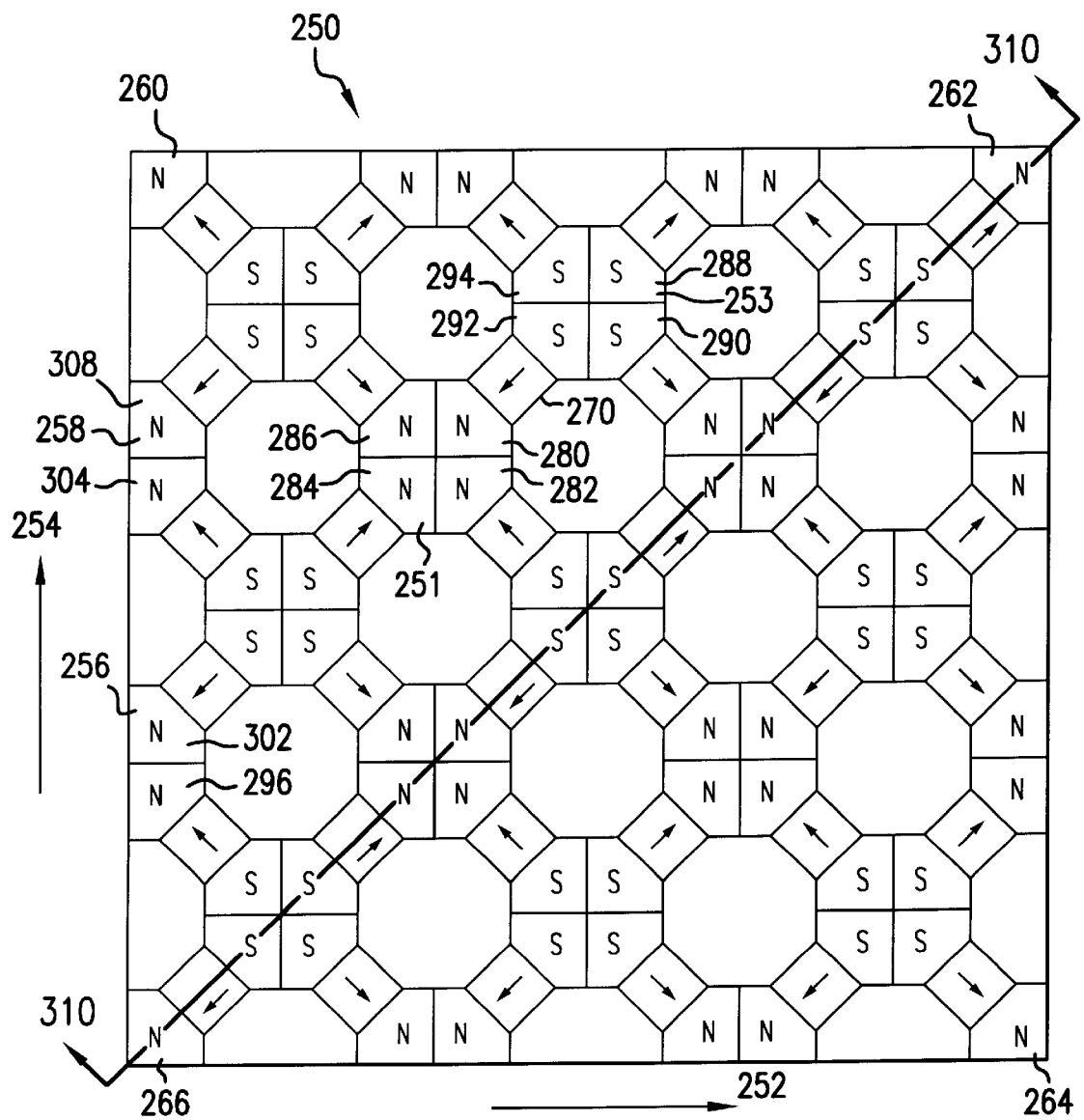
FIG. 2 diagrammatically illustrates a top view of a magnet array in accordance with another embodiment of the present invention.

FIG. 2 diagrammatically illustrates a top view of a magnet array 250 in accordance with another embodiment of the present invention. The magnet array 250 in this embodiment differs from the magnet array 100 in the previous embodiment in that the magnet arrangements result in a same polarity in rows and columns in directions 252 and 254 instead of along diagonals of the directions 252 and 254 as in the embodiment 100. The magnet array 250 is appropriate for a different type of two-dimensional electric motor than the magnet array 100. (For example, Hinds describes a type of electric motor that can take advantage of the inventive magnet array 250.) However, the same principles of using wedge magnets and completing flux paths applies to the magnet array 250.

Each of the magnet arrangements has wedge magnets. For example, interior magnet arrangements 251 and 253 both have four wedge magnets each. The magnet arrangement 251 has wedge magnets 280, 282, 284, and 286, while the magnet arrangement 253 has wedge magnets 288, 290, 292, and 294. A transverse magnet 270 is between wedge magnets 280 and 292.

The exterior magnet arrangements have fewer wedge magnets than in the embodiment 100. The exterior magnet arrangements which are not on the corners, such as magnet arrangements 256 and 258, have two wedge magnets each: wedge magnets 296 and 302 for arrangement 256 and wedge magnets 304 and 308 for arrangement 258. Each of the corner magnet arrangements 260, 262, 264, and 266 each now only have one wedge magnet.

Broadly speaking, the embodiment 250 is similar to the embodiment 100 rotated by 45 degrees about the direction 180 out of the plane of the page in FIG. 1C. One of ordinary skill in the art will notice that the polarization profile along a section such as section 310 has essentially the same profile as shown in FIG. 1D. This assumes that the backing panel used for the embodiment 250 has its convex projections also rotated by 45 degrees.

Generally, a wedge magnet is any permanent magnet having its polarization or magnetization direction at a non-zero, non-perpendicular angle with respect to a portion of its surface. Perpendicular angles are construed to be 90 degrees plus or minus multiples of 180 degrees. In some embodiments, the wedge magnets have a high residual flux greater than 12,000 Gauss. The wedge magnets are coated to prevent corrosion in some embodiments. Suitable coatings include aluminum as might be deposited, for example, by sputtering, an epoxy coating or nickel plating.

Various specific wedge magnet embodiments suitable for usage in the embodiment 100 will now be described with reference to FIGS. 3A–3D and FIGS. 4A–4D. A specific wedge magnet embodiment for usage in the embodiment 250 will be described with reference to FIGS. 5A–5D.

Figure 3A:
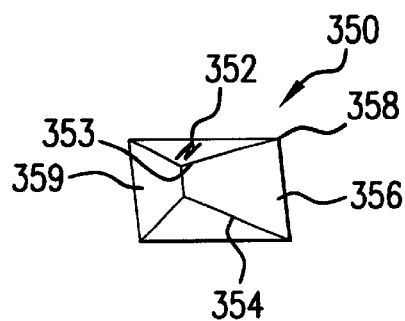
FIGS. 3A–3D diagrammatically illustrate the configuration of a wedge magnet appropriate for usage on the interior of the magnet array illustrated in FIG. 1C.
Figure 3B:
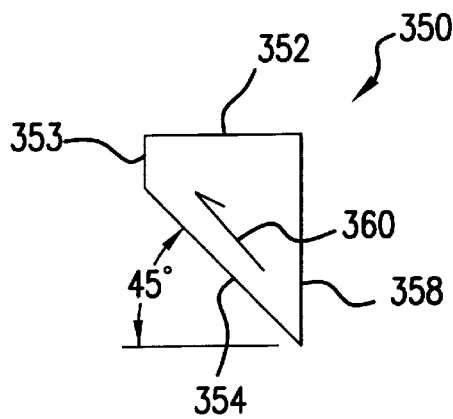
Figure 3C:
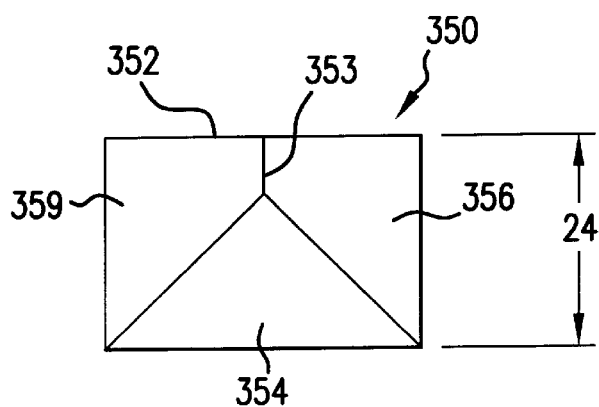
Figure 3D:
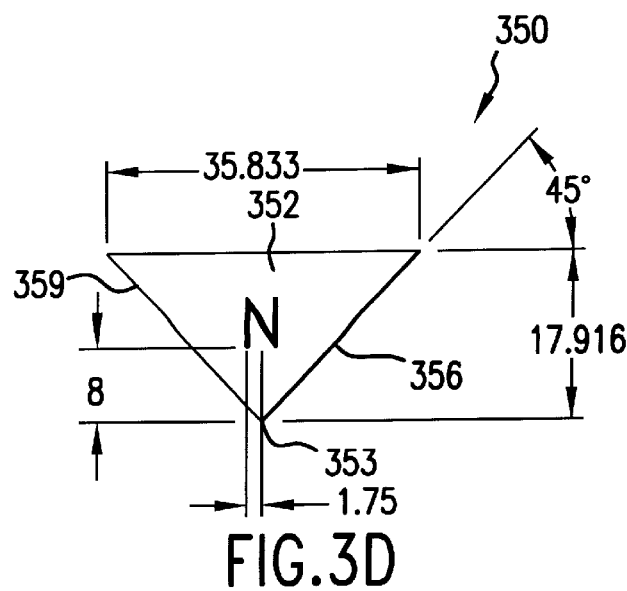

FIGS. 3A–3D show a north wedge magnet appropriate for usage on the interior of the magnet array 100 such as for wedge magnets 136, 138, 150 and 156 in FIG. 1C. As shown in the perspective view in FIG. 3A, a wedge magnet 350 has five faceted surfaces. A surface 352 becomes part of a flat surface formed by a magnet arrangement when combined with other wedge magnets. A surface 354 becomes part of a concave surface formed with other wedge magnets as part of a magnet arrangement. In the illustrated embodiment, the surface 354 is 45 degrees with respect to surface 352. The surface 354 mates with a facet of a convex projection of the backing panel 210 shown in FIG. 1E. Surfaces 356 and 359 mate with corresponding adjacent surfaces of other wedge magnets to form a magnet arrangement. A surface 358 forming a back surface of the wedge magnet 350 (not in view in FIG. 3A) is placed in juxtaposition to a transverse magnet in the magnet array 100. A magnetization direction 360 is approximately parallel to the surface 354 in some embodiments. In some embodiments, the magnetization direction 360 forms an approximately 45-degree angle with respect to the surface 352. The angle may depend on size and geometry of the wedge magnets, and the overall magnetic efficiency desired for the magnet array. FIG. 3B shows a side projection of the wedge magnet 350. FIG. 3C shows a front view of the wedge magnet 350, and FIG. 3D shows a top view of the wedge magnet 350. It is noted that surfaces 354, 356 and 359 converge at edge 353. The length of edge 353 may be short, and even to the extent that it is zero (i.e., the surfaces 354, 356 and 359 converge to a point).

Figure 4A:
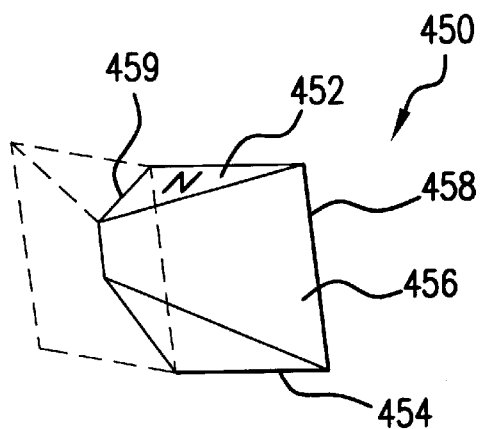
FIGS. 4A–4D diagrammatically illustrate the configuration of a wedge magnet appropriate for usage as a half flux wedge magnet on an exterior of the magnet array illustrated in FIG. 1C.
Figure 4B:
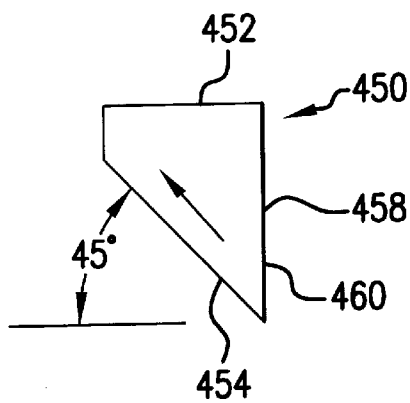
Figure 4C:
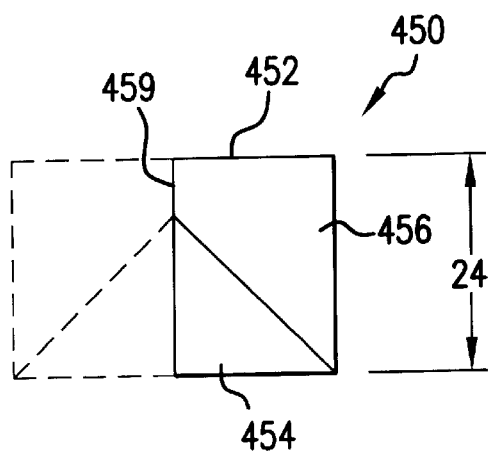
Figure 4D:
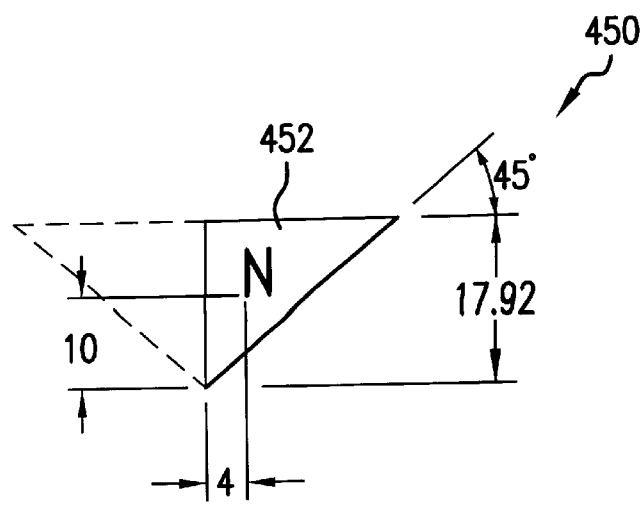

FIGS. 4A–4D show an embodiment 450 of a wedge magnet appropriate for usage as a half flux wedge magnet such as the wedge magnets 152, 160, and 162 shown in the FIG. 1C of the embodiment 100. FIG. 4A is a perspective view of the wedge magnet 450. FIG. 4B shows a side projection of the wedge magnet 450. FIG. 4C shows a front view of the wedge magnet 450, and FIG. 4D shows a top view of the wedge magnet 450. Essentially, the wedge magnet 450 is the wedge magnet 350 cut in half. The wedge magnet 450 has facets or surfaces 452, 454, 456, 458, and 459. Facet 452 forms part of a flat surface formed by a combination of wedge magnets forming a magnet arrangement. Facet 454 mates with a convex projection, such as the projection 216, on the backing panel 210 shown in FIG. 1E. The facet 456 mates with a corresponding facet, such as facet 359, of the embodiment 350. The facet 458 is juxtaposed with a transverse magnet, such as 176 in FIG. 1C, to form a flux path. Facet 459 is an exposed surface at an edge of the magnet array 100. A polarization direction 460 is approximately parallel to the facet 454 and at an angle of approximately 45 degrees with respect to the facet 452.

Figure 5A:
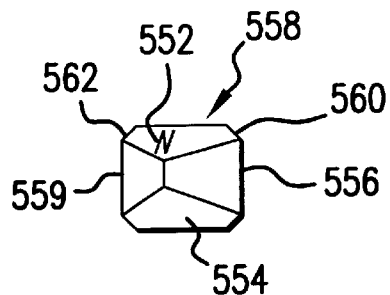
FIGS. 5A–5D diagrammatically illustrate a wedge magnet appropriate for usage in the magnet array illustrated in FIG. 2.
Figure 5B:
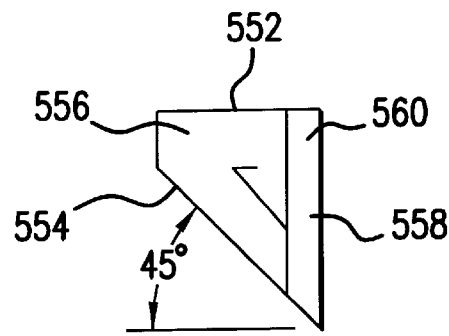
Figure 5C:
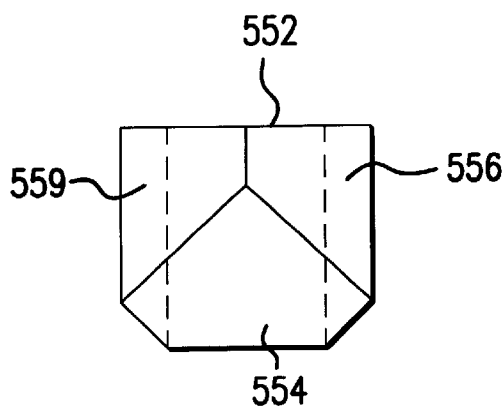
Figure 5D:
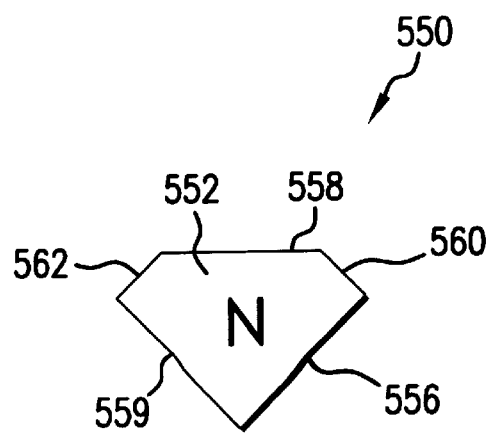

FIGS. 5A–5D show a north wedge magnet appropriate for usage on the interior of the magnet array 250 such as for wedge magnet 280 in FIG. 2. FIG. 5A is a perspective view of wedge magnet 550. FIG. 5B shows a side projection of the wedge magnet 550. FIG. 5C shows a front view of the wedge magnet 550, and FIG. 5D shows a top view of the wedge magnet 550. A wedge magnet 550 has seven faceted surfaces. A surface 552 becomes part of a flat surface formed by a magnet arrangement when combined with other wedge magnets. A surface 554 becomes part of a concave surface formed with other wedge magnets as part of a magnet arrangement. The surface 554 mates with a facet of a convex projection of a backing panel in some embodiments. Surfaces 556 and 559 mate with corresponding adjacent surfaces of other wedge magnets to form a magnet arrangement. When placed at a corner of the array 250, such as for wedge magnet 260, the surfaces 556 and 559 would be exposed and would not mate with surfaces of another wedge magnet. For an exterior magnet not at a corner of the array, such as wedge magnet 308, one of the surfaces 556 and 559 mates with a surface of another wedge magnet. A surface 558 forming a back surface of the wedge magnet 550 is placed in juxtaposition to a transverse magnet in the magnet array 250. A magnetization direction 560 is approximately parallel to the surface 554 in some embodiments. In some embodiments, the magnetization direction 560 forms an approximately 45 degree angle with respect to the surface 552.

The wedge magnet 550 has two more facets than wedge magnet 350 in FIGS. 3A–3D. Facet 560 is adjacent to, and bounded by, facets 552, 554, 556, and 558. Essentially, facet 560 correspond to a surface formed by cutting off a corner separating surfaces 356 and 358 in embodiment 350. Similarly, a surface or facet 562 is adjacent to, and bounded by, facets 552, 554, 559, and 558. Essentially, facet 562 corresponds to a surface formed by cutting off a corner separating surfaces 359 and 358 in embodiment 350.

FIGS. 8A–C illustrate an embodiment of wedge magnets having a less complicated geometry. FIG. 8A is a side view of a magnet array 800 having wedge magnets that defines a flat surface 802 for bonding to the backing panel 804 instead of concave surfaces as in the earlier embodiments. In this embodiment, the wedge magnets are in the shape of a regular 5-sided triangular prism. The corner pieces 806 and 808 (corresponding to pieces 174 and 162 in FIG. 1D) and edge pieces 810, 812, 814, 816 etc. (corresponding to pieces 146, 152, 154, 158 etc. in FIG. 1D) are right-angled triangular prismatic blocks as illustrated in FIG. 8B. The interior pieces 820 (not shown in FIG. 8A; corresponding to pieces 150, 156, 130, 132, 134, 138, 140, 142, etc. in FIG. 1C) are also right-angled triangular prismatic blocks, each twice as large as a corner piece 806 (i.e., each corner piece 806 is substantially a symmetrical halve of an interior piece 820). The magnetic flux in each wedge magnet (corner pieces and interior pieces) is at an angle to the triangular surface. In other words, the magnetic flux in each wedge magnet is at an angle to the reference plane defined by the magnet arrangement comprising the prismatic blocks. As in the earlier embodiments, transverse magnets 822, 824, 826, etc. are provided between the wedge magnets as illustrated in FIG. 8A. The prismatic shaped wedge magnets are relatively easier and less expensive to fabricate compared to the irregular prism shaped wedge magnets in the earlier described embodiments. However, the weight of the wedge magnets are relatively heavier, so the magnetic flux to mass ratio would be relative lower as compared to the earlier described embodiments.

The invention's two-dimensional electric motors (or planar motors) contain the invention's magnet arrays. Substituting the invention's magnet arrays exemplified in embodiments 100 in FIGS. 1A–1D and 250 in FIG. 2 for conventional magnet arrays in conventional two-dimensional electric motors creates embodiments of the invention's two-dimensional electric motors. For example, Asakawa describes an exemplary electric motor suitable for using the magnet array embodiment 100. Chitayat, Hinds, and the Related Patent Application describe electric motors suitable for using the magnet array embodiment 250. Those of ordinary skill in the art will readily appreciate that multiphase two-dimensional motors can be formed based upon the information in the background references and patents combined with the coil array description below.

Figure 9:
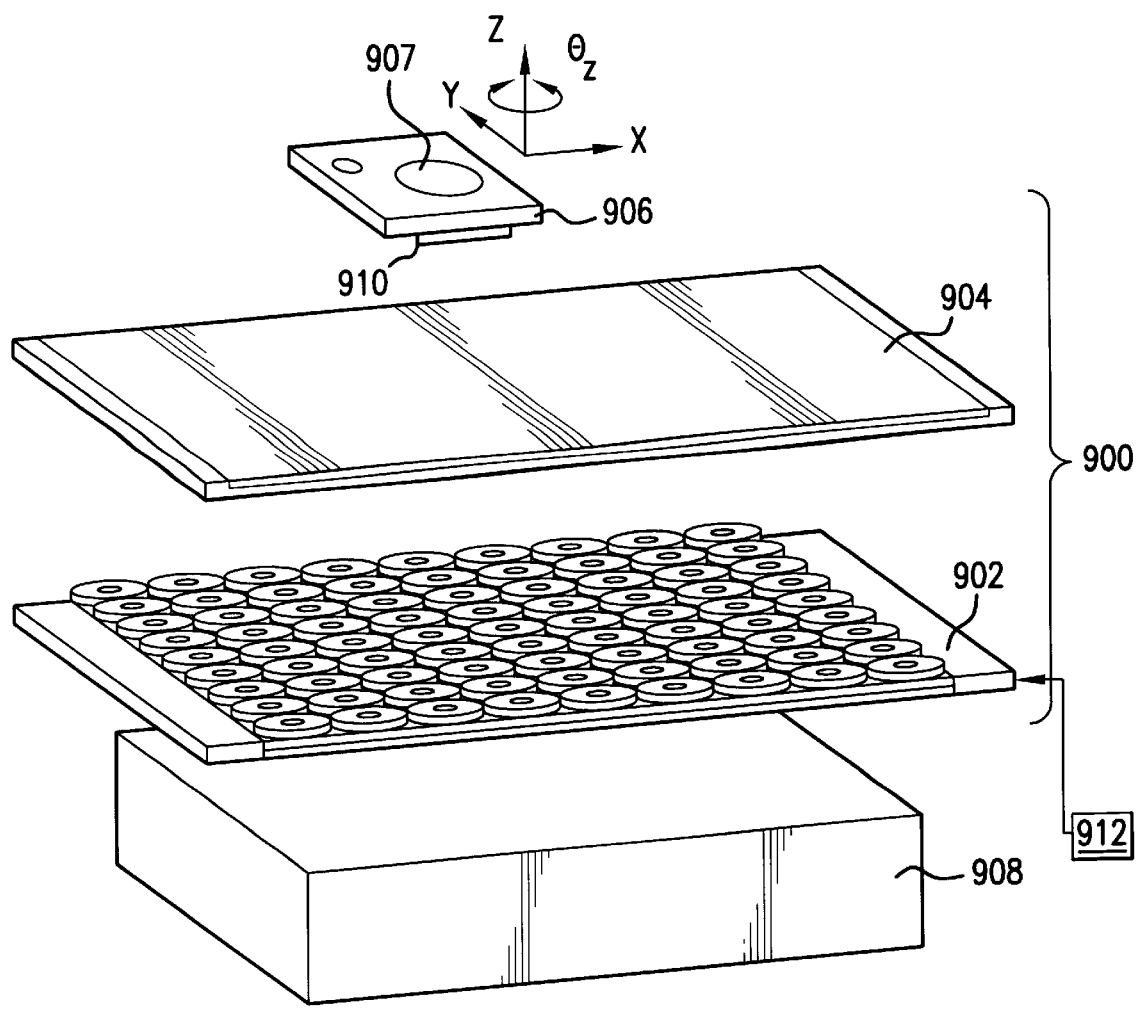
FIG. 9 is a schematic exploded schematic view of a planar motor in which the magnet array of the present invention may be incorporated.

FIG. 9 schematically illustrates the general components of a planar motor 900 in which the magnet array moves in reference to a stationary coil array. The planar motor 900 comprises an array 902 of magnetic coils supported on a base 908. The coil array 902 is electrically energized under control of a controller 912 to effect the operation of the planar motor. A top plate 904 may be provided which is positioned above the coil array 902. The top plate 904 may be made of non-magnetic materials, for example, carbon fiber plastics, ceramics such as Zerodur ceramics, $Al_2O_3$ ceramics, and other materials that do not impair the magnetic flux of permanent magnets in the moving stage 906. The moving stage 906 rests on the top plate 904 (preferably in the presence of an air bearing). The underside of the moving stage 906 has an array 910 of permanent magnets (such as the array 100 shown in FIG. 1) configured to interact with the coil array 902 to produce forces, for example, in the X, Y and $\theta_Z$ directions to move the moving stage 906 across the top plate 904.

For simplicity, many details of the planar motor are omitted from FIG. 9, as they alone do not constitute a part of the present invention. Structural details and operational principles of planar motors may be referenced to the prior art, such as the U.S. Pat. Nos. 4,535,278 and 4,555,650 to Asakawa, which are fully incorporated by reference herein.

The moving stage may include a means 907 (e.g., a chuck) for supporting an article for precise positioning across a two-dimensional plane. For example, the moving stage may comprise a wafer stage having a wafer chuck for supporting a wafer for photolithography processing in the manufacturing of semiconductor devices. Examples of photolithographic systems that may incorporate a planar motor of the present invention include U.S. Pat. No. 5,773,837 to Nakasuji, U.S. Pat. No. 5,477,304 to Nishi, U.S. Pat. No. 5,715,037 to Saiki et al, U.S. Pat. No. 5,528,118 to Lee and U.S. Pat. No. 5,623,853 to Novak, which are fully incorporated by reference herein.

Figure 10:
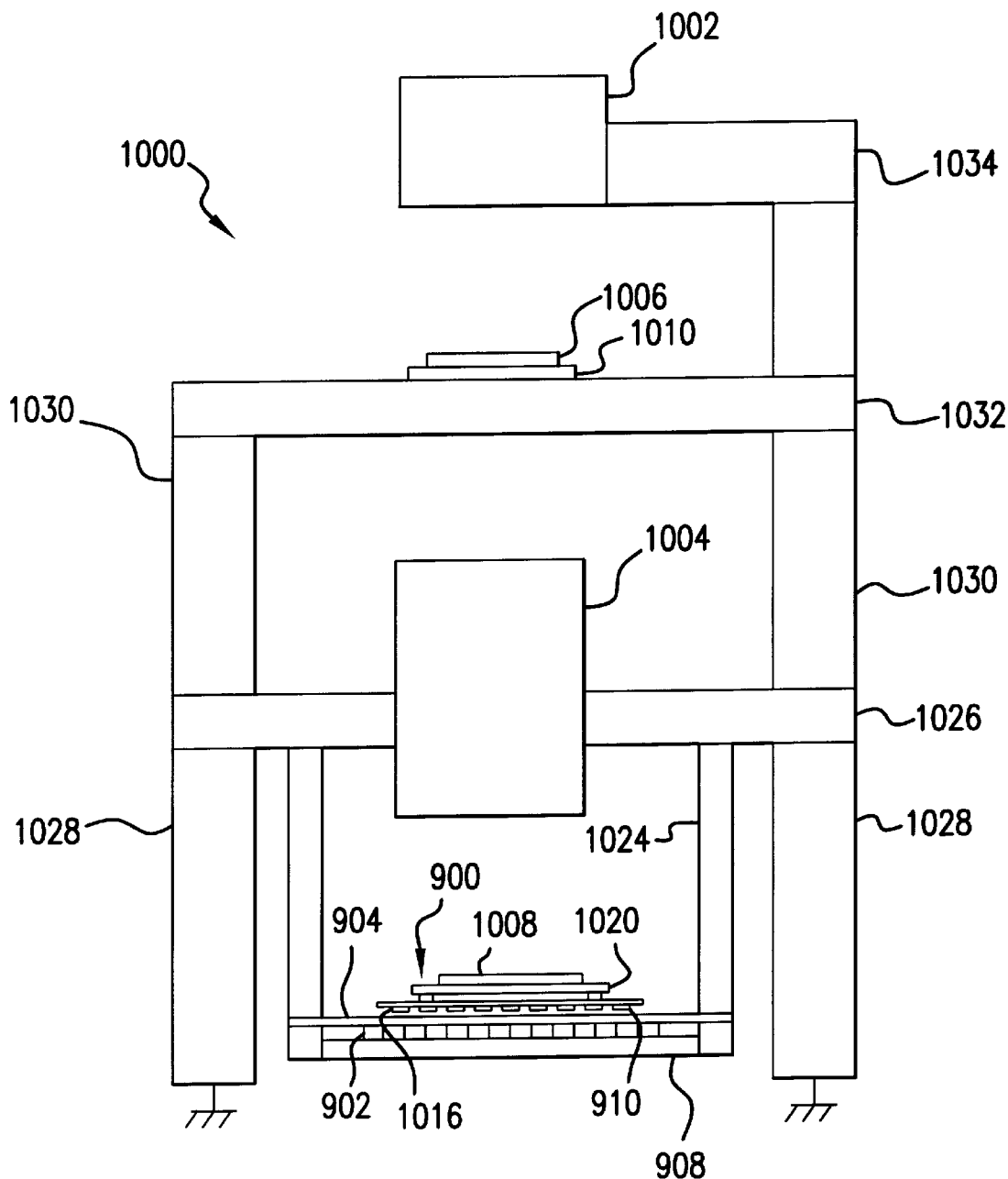
FIG. 10 is a schematic representation of an example of a photolithography system using the planar motor of the present invention.

FIG. 10 schematically illustrates an example of a photolithography system 1000 using the planar motor 900 of the present invention. The lithography system 1000 generally comprises an illumination system 1002 and a moving magnet planar motor 900 for wafer support and positioning. The illumination system 1002 projects light through a mask pattern (e.g., a circuit pattern for a semiconductor device) on a reticle 1006 which is supported by and scanned using stage 1010. The reticle stage 1010 is supported by a frame 1032. The light is focused through a system of lenses 1004 supported on a frame 1026, which is in turn connected to the ground through a support 1028. The lens system 1004 is also connected to the illumination system 1002 through frames 1026, 1030, 1032, and 1034. The light exposes the mask pattern on a layer of photoresist on a wafer 1008.

The wafer 1008 is supported by and scanned using a wafer stage 1020 that is in turn supported and positioned by the planar motor 900. The planar motor 900 comprises the moving magnet array 910 and a fixed coil array 902. Although the photolithography system 1000 is described as utilizing a planar motor in which the permanent magnets are attached to the moving stage, the photolithography system may be adapted to utilize a moving coil planar motor or other variations of the moving magnet planar motor. The wafer stage 1020 and the moving magnet array 910 are supported by air bearings 1016 on the top plate 904. The wafer stage system, including the base 908, is connected to the frame 1026 through the frame 1024.

A similar planar motor may be used in the reticle stage 1010. Details of the implementation is not shown, but a person skilled in the art can implement the planar motor in the reticle stage 1010 without undue experimentation given the disclosure herein.

It is to be understood that the photolithography system may be different than the one shown herein without departing from the scope of the invention. It is also to be understood that the application of the planar motor of the present invention disclosed herein is not to be limited to wafer processing systems.

Figure 6:
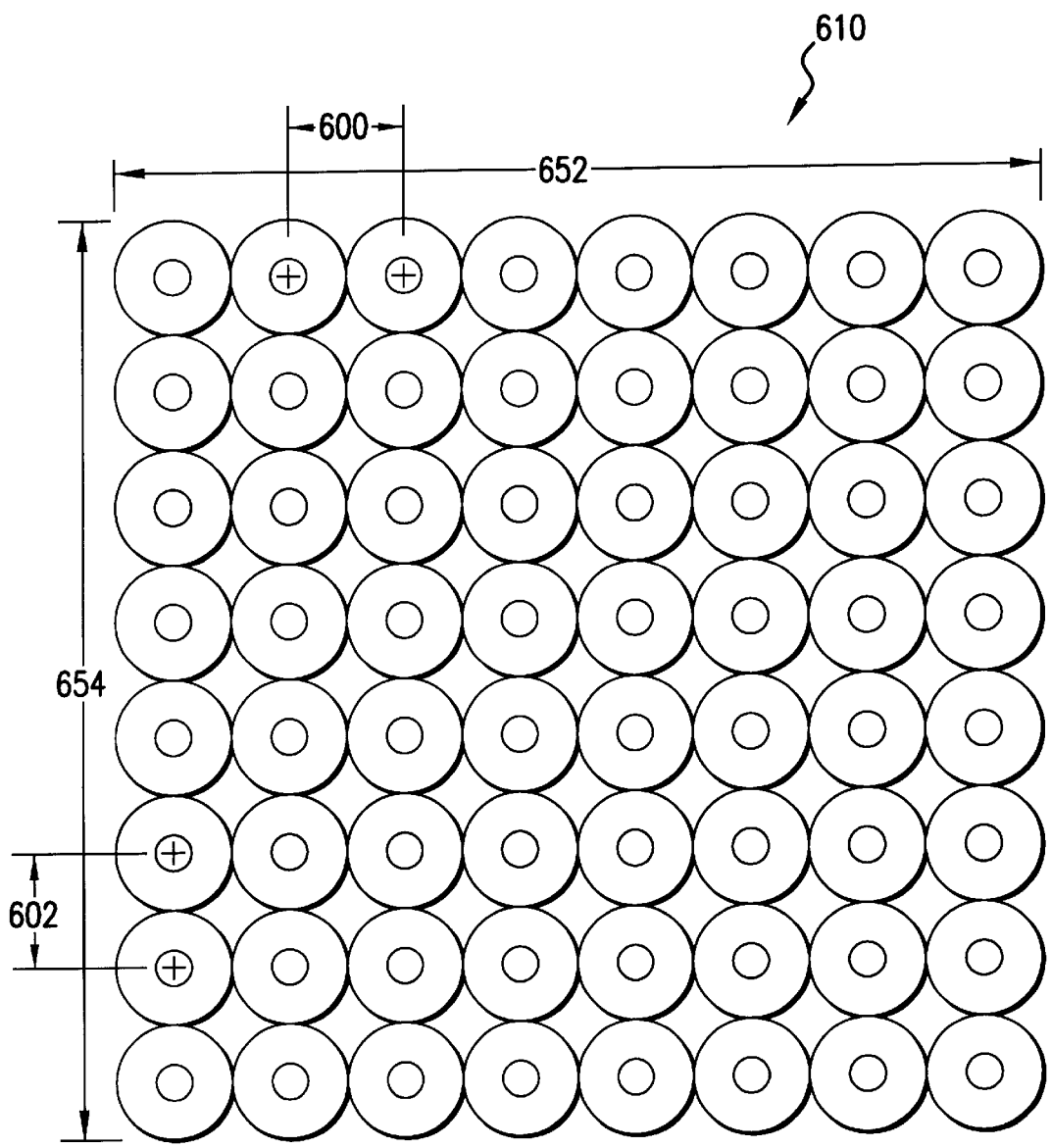
FIG. 6 is a diagrammatic representation of top view of an embodiment of a coil array used in a two-dimensional electric motor of the present invention.

An embodiment of a coil array suitable for use with the embodiments 100 and 250 to form the invention's electric motors will now be described. FIG. 6 is a diagrammatic representation of an elevational view of a coil array 610 appropriate for usage with the magnet array embodiments above to form a two dimensional electric motor. As shown in FIG. 6, the coil array 610 has coils arranged in a rectangular pattern. The coil array 610 has periodicities 600 and 602 which may or may not be equal depending on the embodiment. When the periodicities 600 and 602 are approximately equal and the widths 652 and 654 are approximately equal, the coil array 610 has a "square" periodicity.

Each coil in the coil array 610 has approximately the same shape. As depicted in FIG. 6, the coils have a toroidal shape. When the periodicities 600 and 602 are unequal, the coils will each have a somewhat oval profile. In some embodiments, the coils will have a squared profile in the toroidal shape. Such a squared profile is depicted in the embodiment 610 shown in FIG. 6.

The magnet array periodicities are related to the coil array periodicities. In some embodiments of the invention's electric motor including the magnet array I100, the coil periodicities 600 and 602 are ¾ the magnet periodicities 124 and 126 in the directions 103 and 102.

Figure 7A:
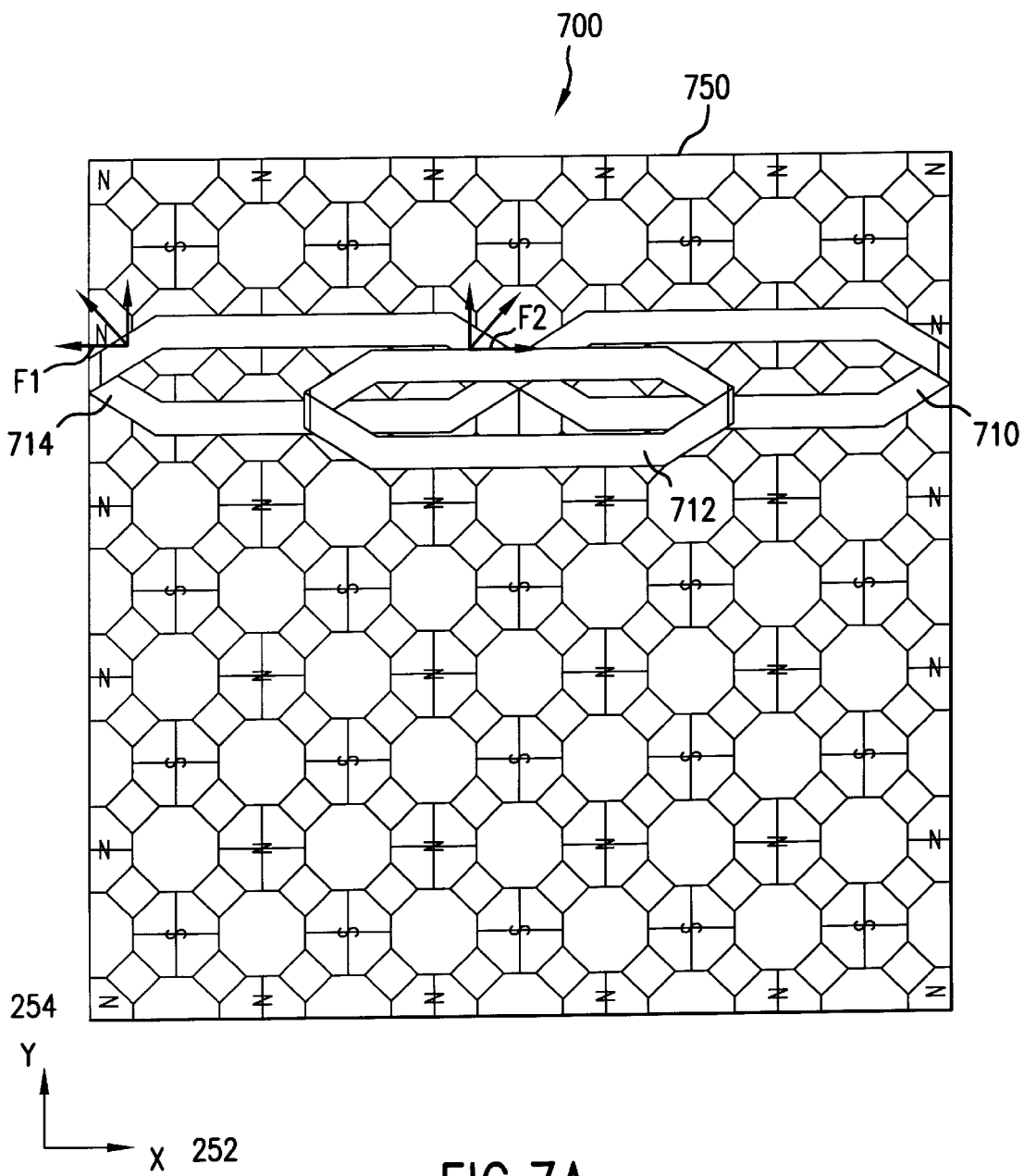
FIGS. 7A–7B diagrammatically illustrate an embodiment of a two dimensional electric motor in accordance with the present invention.
Figure 7B:
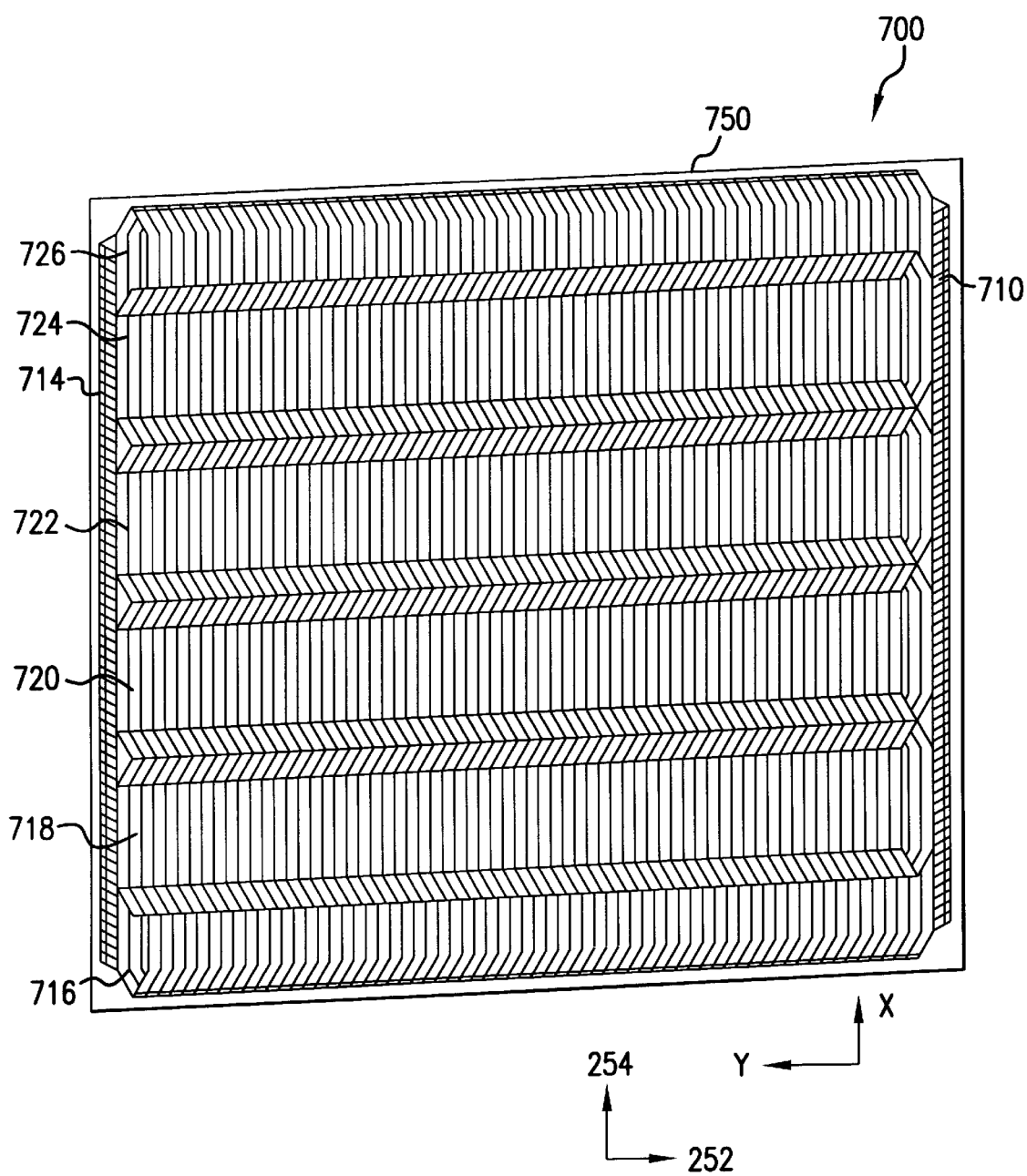

FIGS. 7A and 7B illustrate an embodiment of an electric motor 700 including a magnet array 750 having the similar structure as the magnet array 250 except that the magnet array 750 has more periods in the directions 252 and 254. The Related Patent Application discusses the overall function of the motor 700 without wedge magnets. The electric motor embodiment 700 in the present invention uses wedge and transverse magnets. Since the wedge magnets combine to form magnet arrangements having resultant north and south fluxes in and out of the page, the electric motor 700 moves in the same way as the motor described in the co-pending patent application.

Currents in coils 710, 712, and 714 electromagnetically interact with the magnet array 750 to cause relative forces and motion along the direction 254. Each coil 710, 712, and 714 shown is longer along the direction 252. Additional, similarly shaped coils overlap the coils 710, 712, and 714 to form three columns of coils carrying currents which interact with the magnet array 750 to cause relative forces and motion along the direction 254. Rows of coils arranged orthogonal to coil columns 710, 712 and 714 each having a greater length in the direction 254 overlap the coil columns 710, 712 and 714 to provide forces and movement along the direction 252. FIG. 7B illustrates a combined arrangement of coil rows 716, 718, 720, 722, 724 and 726 on top of coil columns 710, 712 and 714. The combined arrangement provides forces and motion along both directions 252 and 254.

It is to be understood that while the magnetic coil array has been described above to be stationary and the permanent magnet array to be movable relative to the stationary coils, it is to be understood that the two-dimensional motors of the present invention may be implemented with a stationary permanent magnetic array and a movable magnetic coil array without departing from the scope and spirit of the present invention.

The invention uses magnets whose magnetization directions are angled with respect to a reference surface to complete flux paths and enhance flux perpendicular to the reference surface. Particularly when used in conjunction with transverse magnets whose magnetization directions are approximately parallel to the surface, this design greatly enhance fluxes perpendicular to the surface. The invention permits magnet arrays to have greatly increased flux-to-mass ratios by increasing the perpendicular fluxes while simultaneously doing away with heavy, magnetically permeable backings. The invention's magnet arrays are particularly useful in two-dimensional electric motors.

Although only a few exemplary embodiments of this invention have been described in detail above, those skilled in the art will readily appreciate that many modifications are possible in the exemplary embodiments without materially departing from the novel teachings and advantages of this invention. For example, although depicted as being planar, the arrays of magnetic poles and coils can have either constant or varying curvature in one or two-dimensions as in cylindrical, toroidal, and spherical arrangements of magnetic poles and coils. For cylindrical arrangements, latitudinal and longitudinal directions may be defined, for example, in standard cylindrical coordinates with corresponding diagonal directions, and parallel arrays and coils lie on parallel surfaces. Additionally, the magnet arrays may have various magnetically impermeable backings, and the magnetized material forming the wedge and transverse magnets may be any suitable magnetized material. Although magnet arrays overlaying backings with concave projections have been described, suitable wedge and transverse magnets may arranged on flat or curved backings without concave projections or with convex dimples. Accordingly, all such modifications are intended to be within the scope of the following claims.

We claim:

1. A magnet array comprising a plurality of magnets disposed generally in a reference plane, wherein each of said magnets has a magnetic polarization at an angle to said reference plane and are arranged in groups, each group creating a resultant magnetic polarization substantially perpendicular to the reference plane such that the resultant magnetic polarization of each group alternates in a periodic manner along two orthogonal directions across the reference plane.

2. A magnet array as in claim 1 wherein the polarity alternates between immediate adjacent groups along two orthogonal directions across the reference plane.

3. A magnet array as in claim 1 wherein the polarity alternates between immediate adjacent groups along a diagonal of the array.

4. A magnet array as in claim 1 further comprising a plurality of transverse magnets, wherein at least one transverse magnet is disposed between adjacent groups of magnets of opposite polarity.

5. A magnet array as in claim 4 wherein the magnetic polarity of the transverse magnets is substantially parallel to the reference plane.

6. A magnet array as in claim 5 wherein each transverse magnet and adjacent magnets in adjacent groups form a continuous magnetic flux path therethrough.

7. A magnet array as in claim 6 further comprising a plurality of focusing magnets, wherein the focusing magnets are disposed on the groups of magnets at the reference plane for focusing the magnetic flux substantially perpendicular to the reference plane.

8. A magnet array as in claim 1 wherein at least one group of magnets in the interior of the array comprises four magnets juxtaposed in a symmetrical arrangement in the reference plane.

9. A magnet array as in claim 8 wherein each of said four magnets is generally in the shape of a prism.

10. A magnet array as in claim 9 wherein each group of four magnets defines a concave surface at a side opposite the reference plane.

11. A magnet array as in claim 10 further comprising a backing panel on which the plurality of magnets are supported, said backing panel includes convex projections each matching said concave surface of each group of magnets.

12. A magnet array as in claim 9 wherein each of said four magnets is generally in the shape of a right-angled triangular prism.

13. A magnet array as in claim 12 wherein each group of magnets defines a flat surface at a side opposite the reference plane.

14. A magnet array as in claim 1 wherein at least one group of magnets at the edge of the array comprises three magnets juxtaposed in a symmetrical arrangement along the edge.

15. A magnet array as in claim 14 wherein two of said three magnets are substantially each a symmetrical halve of the other one of said three magnets.

16. A magnet array as in claim 1 wherein at least one group of magnets at the corner of the array comprises two magnets juxtaposed in a symmetrical arrangement about the corner.

17. A two-dimensional motor comprising:
a stationary stage; and
a moving stage;
wherein the stationary stage or the moving stage comprises a magnet array having a plurality of magnets disposed generally in a reference plane and the other stage comprises a magnetic coil array, wherein each of the magnets has a magnetic polarization at an angle to said reference plane, the magnets arranged in groups, each group creating a resultant magnetic polarization substantially perpendicular to the reference plane, and the magnets in each group are arranged such that the resultant magnetic polarization of each group alternates in a periodic manner along two orthogonal directions across the reference plane.

18. A two-dimensional motor as in claim 17 wherein the moving stage comprises the magnet array.

19. A two dimensional motor as in claim 17, wherein the magnets in each group are arranged such that the polarity alternates between immediate adjacent groups along two orthogonal directions across the reference plane.

20. A stage device comprising:
a two-dimensional motor which comprises a stationary stage and a moving stage, wherein the stationary stage or the moving stage comprises a magnet array having a plurality of magnets disposed generally in a reference plane and the other stage comprises a magnetic coil array, wherein each of the magnets has a magnetic polarization at an angle to the reference planes, the magnets arranged in groups, each group creating a resultant magnetic polarization substantially perpendicular to the reference plane, and the magnets in each group are arranged such that the resultant magnetic polarization of each group alternates in a periodic manner along two orthogonal directions across the reference plane; and a support member connected to the moving stage, the support member supporting the article for movement in a plane of the two-dimensional motor.

21. A stage device as in claim 20 wherein the moving stage comprises the magnet array.

22. An exposure apparatus, comprising:

an optical system that images a pattern onto an article;

a stage device that positions the article in reference to the optical system, said stage device comprising:

a two-dimensional motor which comprises a stationary stage and a moving stage, wherein the stationary stage or the moving stage comprises a magnet array having a plurality of magnets disposed generally in a reference plane and the other stage comprises a magnetic coil array, wherein each of the magnets has a magnetic polarization at an angle to the reference planes, the magnets arranged in groups, each group creating a resultant magnetic polarization substantially perpendicular to the reference plane, and the magnets in each group are arranged such that the resultant magnetic polarization of each group alternates in a periodic manner along two orthogonal directions across the reference plane; and a support member connected to the moving stage, the support member supporting the article for movement in a plane of the two-dimensional motor.

23. An exposure apparatus as in claim 22 wherein the apparatus is a photolithography system for substrate processing and the article is a substrate.

24. An exposure apparatus as in claim 23 wherein the pattern is a circuit pattern for a semiconductor device and wherein said substrate to be exposed is a wafer.

25. An exposure apparatus as in claim 22, further comprising a pattern stage device that positions the pattern in reference to the optical system, wherein said pattern stage device comprises:

a second two-dimensional motor which comprises a stationary stage and a moving stage, wherein the stationary stage or the moving stage comprises a magnet array having a plurality of magnets disposed generally in a reference plane and the other stage comprises a magnetic coil array, wherein each of the magnets has a magnetic polarization at an angle to the reference planes, the magnets arranged in groups, each group creating a resultant magnetic polarization substantially perpendicular to the reference plane, and the magnets in each group are arranged such that the resultant magnetic polarization of each group alternates in a periodic manner along two orthogonal directions across the reference plane; and a second support member connected to the moving stage of the second two-dimensional motor, the second support member supporting the pattern for movement in a plane of the two-dimensional motor.

26. An exposure apparatus, comprising:

an optical system that images a pattern onto an article;

an article stage device that supports the article in reference to the optical system;

a pattern stage device that positions the pattern in reference to the optical system; said pattern stage device comprising:

a two-dimensional motor which comprises a stationary stage and a moving stage, wherein the stationary stage or the moving stage comprises a magnet array having a plurality of magnets disposed generally in a reference plane and the other stage comprises a magnetic coil array, wherein each of the magnets has a magnetic polarization at an angle to the reference planes, the magnets arranged in groups, each group creating a resultant magnetic polarization substantially perpendicular to the reference plane, and the magnets in each group are arranged such that the resultant magnetic polarization of each group alternates in a periodic manner along two orthogonal directions across the reference plane; and a support member connected to said moving stage, the support member supporting the pattern for movement in a plane of the two-dimensional motor.

27. An exposure apparatus as in claim 26, wherein said article stage device comprises:

a two-dimensional motor which comprises a stationary stage and a moving stage, wherein the stationary stage or the moving stage comprises a magnet array having a plurality of magnets disposed generally in a reference plane and the other stage comprises a magnetic coil array, wherein each of the magnets has a magnetic polarization at an angle to the reference planes, the magnets arranged in groups, each group creating a resultant magnetic polarization substantially perpendicular to the reference plane, and the magnets in each group are arranged such that the resultant magnetic polarization of each group alternates in a periodic manner along two orthogonal directions across the reference plane; and a support member connected to said moving stage, the support member supporting the pattern for movement in a plane of the two-dimensional motor.

28. An exposure apparatus as in claim 26 wherein the pattern is a circuit pattern for a semiconductor device.

29. A magnet array comprising:

a plurality of magnets disposed generally in a reference plane, wherein each of the magnets has a magnetic polarization at an angle to the reference plane, and the magnets are arranged in groups, each group creating a resultant magnetic polarization substantially perpendicular to the reference plane;

a plurality of transverse magnets, wherein at least one transverse magnet is disposed between adjacent groups of magnets of opposite polarity such that the magnetic polarity of the transverse magnets is substantially parallel to the reference plane and adjacent magnets in adjacent groups form a continuous magnetic flux path therethrough; and a plurality of focusing magnets, wherein the focusing magnets are disposed on the groups of magnets at the reference plane for focusing the magnetic flux substantially perpendicular to the reference plane.

30. A magnet array comprising:

a plurality of magnets disposed generally in a reference plane, wherein each of the magnets has a magnetic polarization at an angle to the reference plane, and the magnets are arranged in groups, each group creating a resultant magnetic polarization substantially perpendicular to the reference plane, wherein at least one group of magnets in the interior of the array comprises four magnets juxtaposed in a symmetrical arrangement in the reference plane.

31. A magnet array comprising:

a plurality of magnets disposed generally in a reference plane, wherein each of the magnets has a magnetic polarization at an angle to the reference plane, and the magnets are arranged in groups, each group creating a resultant magnetic polarization substantially perpendicular to the reference plane, wherein at least one group of magnets at the edge of the array comprises three magnets juxtaposed in a symmetrical arrangement along the edge.

32. A magnet array comprising:

a plurality of magnets disposed generally in a reference plane, wherein each of the magnets has a magnetic polarization at an angle to the reference plane, and the magnets are arranged in groups, each group creating a resultant magnetic polarization substantially perpendicular to the reference plane, wherein at least one group of magnets at the corner of the array comprises two magnets juxtaposed in a symmetrical arrangement about the corner.

\* \* \* \* \*